United States Patent
Wang et al.

(10) Patent No.: US 10,952,342 B2
(45) Date of Patent: Mar. 16, 2021

(54) WINDOW PANEL, DISPLAY DEVICE INCLUDING THE WINDOW PANEL, AND MANUFACTURING METHOD OF THE WINDOW PANEL

(71) Applicant: SAMSUNG DISPLAY CO., LTD., Yongin-si (KR)

(72) Inventors: Jiyoung Wang, Asan-si (KR); Junyoung Kim, Cheonan-si (KR)

(73) Assignee: Samsung Display Co., Ltd.

( * ) Notice: Subject to any disclaimer, the term of this patent is extended or adjusted under 35 U.S.C. 154(b) by 253 days.

(21) Appl. No.: 15/819,241

(22) Filed: Nov. 21, 2017

(65) Prior Publication Data
US 2018/0146564 A1    May 24, 2018

(30) Foreign Application Priority Data
Nov. 22, 2016    (KR) .................. 10-2016-0156070

(51) Int. Cl.
*H05K 5/03* (2006.01)
*G02B 5/22* (2006.01)
(Continued)

(52) U.S. Cl.
CPC ............... *H05K 5/03* (2013.01); *G02B 5/003* (2013.01); *G02B 5/22* (2013.01); *G02F 1/133512* (2013.01); *H01L 27/3272* (2013.01); *H01L 51/5237* (2013.01); *H05K 5/0017* (2013.01); *G02F 1/1368* (2013.01); *G02F 1/133308* (2013.01); *G02F 2001/133302* (2013.01); *G02F 2001/133331* (2013.01); *G02F 2001/133388* (2013.01); *H01L 51/0096* (2013.01); *H01L 51/5246* (2013.01); *H01L 2251/558* (2013.01)

(58) Field of Classification Search
CPC .... H05K 5/03; H05K 5/0017; H01L 51/5237; H01L 27/3272; H01L 51/0096; H01L 51/5246; H01L 2251/558; G02B 5/22; G02B 5/003; G02F 1/133512; G02F 2001/133388; G02F 1/133308; G02F 1/1368; G02F 2001/133302; G02F 2001/133331
USPC ........................................ 359/894
See application file for complete search history.

(56) References Cited

U.S. PATENT DOCUMENTS 9,541,964 B2    1/2017 Byun et al.
2013/0094184 A1*  4/2013 Lee .................. G02F 1/133512
                                            362/97.1
(Continued)

FOREIGN PATENT DOCUMENTS

KR    10-2013-0081904    7/2013
KR    10-2016-0061822    6/2016
(Continued)

*Primary Examiner* — Jade R Chwasz
(74) *Attorney, Agent, or Firm* — Innovation Counsel LLP

(57) ABSTRACT

A window panel includes a base substrate, a first light blocking layer, a cover member, and a second light blocking layer. The first light blocking layer covers a covered portion of the base substrate and exposes an exposed portion of the base substrate. The cover member surrounds the exposed portion of the base substrate in a plan view of the window panel, overlaps the first light blocking layer, and has a thickness in a range from 5 nm to 500 nm. The second light blocking layer overlaps both the first light blocking layer and the cover member.

14 Claims, 10 Drawing Sheets

(51) Int. Cl.
*H01L 51/52* (2006.01)
*G02B 5/00* (2006.01)
*G02F 1/1335* (2006.01)
*H01L 27/32* (2006.01)
*H05K 5/00* (2006.01)
G02F 1/1333 (2006.01)
G02F 1/1368 (2006.01)
H01L 51/00 (2006.01)

(56) References Cited

U.S. PATENT DOCUMENTS

2014/0300835 A1* 10/2014 Chu .................... G06F 3/0412
349/12
2016/0216552 A1 7/2016 Jin

FOREIGN PATENT DOCUMENTS

| KR | 10-2016-0093173 | 8/2016 |
| KR | 10-2016-0097461 | 8/2016 |

* cited by examiner

WINDOW PANEL, DISPLAY DEVICE INCLUDING THE WINDOW PANEL, AND MANUFACTURING METHOD OF THE WINDOW PANEL

CROSS-REFERENCE TO RELATED APPLICATION

This application claims priority under 35 U.S.C. § 119 to Korean Patent Application No. 10-2016-0156070, filed on Nov. 22, 2016, in the Korean Intellectual Property Office (KIPO); the disclosure of the Korean Patent Application is incorporated by reference herein in its entirety.

BACKGROUND

1. Technical Field

The technical field is related to a window panel, a display device including the window panel, and a method of manufacturing the window panel.

2. Description of Related Art

Flat panel display (FPD) devices such as organic light emitting diode (OLED) display devices or liquid crystal display (LCD) devices include a plurality of pairs of electric field generating electrodes and an electro-optical active layer interposed between the electric field generating electrodes. An OLED display device includes an organic light emitting layer as an electro-optical active layer, and an LCD device includes a liquid crystal layer as an electro-optical active layer.

In general, a display device includes a display panel which generates and displays an image and includes a window panel which is disposed on the display panel to protect the display panel. The image generated in the display panel may be transmitted to the observer through the window panel. Such a window panel may include a bezel portion. The bezel portion is disposed at a non-display area in which no image is displayed.

This background section is intended to provide useful background for understanding the technology disclosed herein. The background section may include ideas or concepts that were not part of what was known or appreciated by those skilled in the pertinent art prior to a corresponding effective filing date of subject matter disclosed herein.

SUMMARY

Embodiments may be directed to a window panel including a bezel portion which includes a cover member.

Embodiments may be directly to a method of manufacturing a window panel.

Embodiments may be directed to a display device including a window panel.

According to an embodiment, a window panel may include the following elements: a base substrate; and a bezel portion at at least a portion of the base substrate. The bezel portion includes: a first light blocking layer on the base substrate; a cover member on the base substrate, the cover member overlapping at least a portion of the first light blocking layer; and a second light blocking layer on the first light blocking layer and the cover member. The cover member has a thickness in a range from about 5 nm to about 500 nm.

The first light blocking layer and the cover member may be disposed on a substantially same layer.

The deposition patter may include a metal.

The window panel may further include a decor layer between the base substrate and the cover member.

The bezel portion may have a sensor hole.

The window panel may further include an infrared light transmitting coating layer disposed at the sensor hole.

According to an embodiment, a method of manufacturing a window panel may include the following steps: forming a first light blocking layer on a base substrate, the first light blocking layer defining a light transmitting area and a light blocking area; disposing a mask at the light transmitting area; forming a deposited layer over an entire surface of the base substrate including a surface of the base substrate exposed through the mask; removing the mask to form a cover member; and forming a second light blocking layer on the first light blocking layer and the cover member.

The deposited layer may overlap at least a portion of the first light blocking layer.

The deposited layer may have a thickness in a range from about 5 nm to about 500 nm.

The deposited layer may include a metal.

The mask may be a polymer film.

The mask may be a soluble ink.

The method may further include forming a decor layer on the base substrate before forming the deposited layer.

Forming of the first light blocking layer may further include defining a sensor hole area on the base substrate.

The method may further include defining a sensor hole after forming the second light blocking layer.

According to an embodiment, a display device may include the following elements: a display panel including a display area and a non-display area; and a window panel on the display panel. The window panel includes: a base substrate; and a bezel portion on the base substrate, the bezel portion overlapping the non-display area of the display panel. The bezel portion includes: a first light blocking layer on the base substrate; a cover member on the base substrate, the cover member overlapping at least a portion of the first light blocking layer; and a second light blocking layer on the first light blocking layer and the cover member. The cover member has a thickness in a range from about 5 nm to about 500 nm.

An embodiment may be related to a window panel. The window panel may include a base substrate, a first light blocking layer, a cover member, and a second light blocking layer. The first light blocking layer may cover a covered portion of the base substrate and may expose an exposed portion of the base substrate. The cover member may surround the exposed portion of the base substrate in a plan view of the window panel, may overlap the first light blocking layer, and may have a thickness in a range from 5 nm to 500 nm. The second light blocking layer may overlap both the first light blocking layer and the cover member.

The window panel may include a second light blocking layer covering both the first light blocking layer and the cover member. The cover member may be positioned between the first light blocking layer and the second light blocking layer and may directly contact at least one of the first light blocking layer and the second light blocking layer.

A face of the first light blocking layer may be coplanar with a face of the cover member.

The cover member may be a metal member.

The window panel may include a decor layer positioned between the base substrate and the cover member and directly contacting at least one of the base substrate, the cover member, and the first light blocking layer.

The first light blocking layer may have a through hole. A portion of the first light blocking layer may be positioned between the hole and the exposed portion of the base substrate.

The window panel may include an infrared light transmitting coating layer disposed in the through hole.

An embodiment may be related to a method of manufacturing a window panel. The method may include the following steps: forming a first light blocking layer on a base substrate, the first light blocking layer covering a covered portion of the base substrate and exposing an exposed portion of the base substrate; disposing a mask, the mask covering the exposed portion of the base substrate and exposing an exposed portion of the first light blocking layer; forming, through a deposition process, a material layer over the base substrate, wherein a first potion of the material layer may directly contact the mask, and wherein a second portion of the material layer may directly contact the exposed portion of the first light blocking layer; removing both the first portion of the material layer and the mask to form a cover member using the second portion of the material layer; and forming a second light blocking layer on the first light blocking layer and the cover member.

The second light blocking layer may directly contact at least one of the first light blocking layer and the cover member.

The material layer may have a thickness in a range from 5 nm to 500 nm.

The material layer may be a metal layer.

The mask may be a polymer film.

The mask may be formed of soluble ink.

The method may include forming a decor layer on the base substrate before forming the material layer.

The method may include forming a through hole in the first light blocking layer. A portion of the first light blocking layer may be positioned between the through hole and the exposed portion of the base substrate.

The method may include forming a through hole in the cover member. A portion of the cover member may be positioned between the through hole and the exposed portion of the base substrate.

An embodiment may be related to a display device. The display device may include the following elements: a display panel may include a display area and a non-display area; a base substrate overlapping the display panel; a first light blocking layer positioned between the display panel and the base substrate, overlapping the non-display area, and exposing the display area; a cover member positioned between the display panel and the base substrate, overlapping at least a portion of the first light blocking layer, overlapping the non-display area, exposing the display area, and having a thickness in a range from 5 nm to 500 nm; and a second light blocking layer overlapping both the first light blocking layer and the cover member.

The second light blocking layer may be positioned between the display panel and the first light blocking layer, may be positioned between the display panel and the cover member, may overlap the non-display area, and may expose the display area.

The cover member may surround the display area in a plan view of the display device.

A portion of the cover member may directly contact the first light blocking layer and may be positioned between the display panel and the first light blocking layer.

The base substrate may be transparent and may directly contact both the first light blocking layer and the cover member.

DETAILED DESCRIPTION

Figure 1:
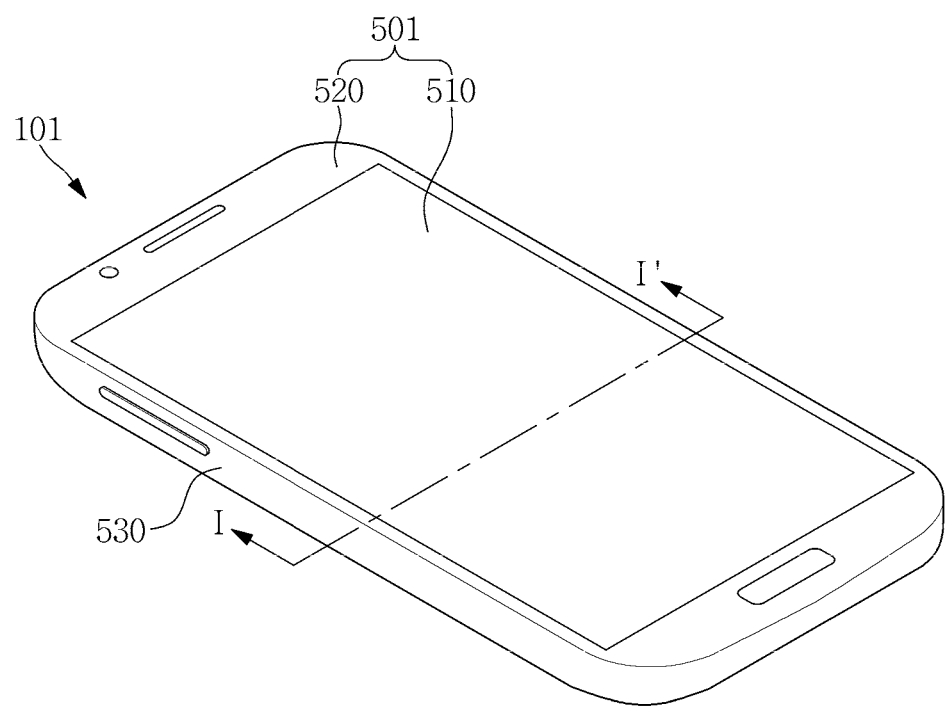
FIG. 1 is a perspective view illustrating a display device according to an embodiment.

Embodiments are described with reference to the accompanying drawings. The embodiments may be modified in various manners. The scopes of the embodiments include all practical changes, equivalents, and substitutions.

Although the terms "first," "second," etc. may be used herein to describe various elements, these elements, should not be limited by these terms. These terms may be used to distinguish one element from another element. Thus, a first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-type (or first-set)," "second-type (or second-set)," etc., respectively.

In the drawings, thicknesses of layers may be illustrated in an enlarged manner for clarity and ease of description.

When a first element is referred to as being "on" a second element, the first element may be directly on the second element, or at least one intervening element may be present between the first element and the second element. Conversely, when a first element is referred to as being "directly on" a second element, no intended intervening element (except environmental elements such as air) may be present between the first element and the second element.

The spatially relative terms "below", "beneath", "lower", "above", "upper" and the like, may be used herein for ease of description to describe the relations between one element and another element as illustrated in the drawings. The spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

When a first element is referred to as being "connected" to a second element, the first element is "directly connected," "indirectly connected," and/or "electrically connected" to the second element.

The terms "comprises," "comprising," "includes" and/or "including," when used in this specification, specify the presence of stated features, integers, steps, operations, elements and/or components, but may not preclude the presence or addition of one or more other features, integers, steps, operations, elements, components and/or groups.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as commonly understood by those skilled in the art to which this invention pertains. Terms, such as those defined in commonly used dictionaries, should be interpreted as having a meaning that is consistent with their meaning in the context of the relevant art and will not be interpreted in an ideal or excessively formal sense unless clearly defined in the present specification.

Like reference numerals may refer to like elements.

Figure 2:
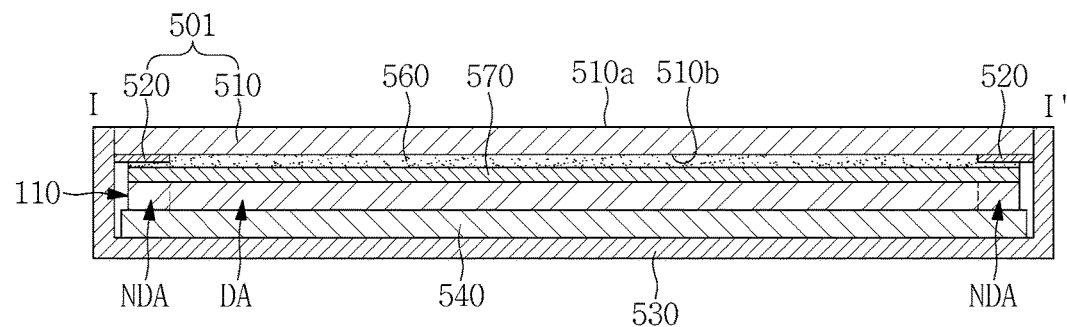
FIG. 2 is a cross-sectional view taken along the line I-I' of FIG. 1 according to an embodiment.

FIG. 1 is a perspective view illustrating a display device 101 according to an embodiment, and FIG. 2 is a cross-sectional view taken along the line I-I' of FIG. 1.

The display device 101 illustrated in FIGS. 1 and 2 includes a window panel 501, a case 530 coupled to the window panel 501 to define a space, and a display panel 110 positioned inside the space.

The display panel 110 is mounted on the case 530 together with a support portion 540. The support portion 540 may be, for example, a cushion member. Elements for driving the display panel 110, e.g., a battery and the like may be disposed at the support portion 540.

The display panel 110 includes a display area DA and a non-display area NDA. The display area DA is a portion in which an image is displayed. The non-display area NDA may surround the display area DA. Examples of the display panel 110 may include an LCD panel, an OLED display panel, or the like.

Referring to FIG. 2, a touch panel 570 and an adhesive layer 560 may be disposed between the display panel 110 and the window panel 501.

Figure 3:
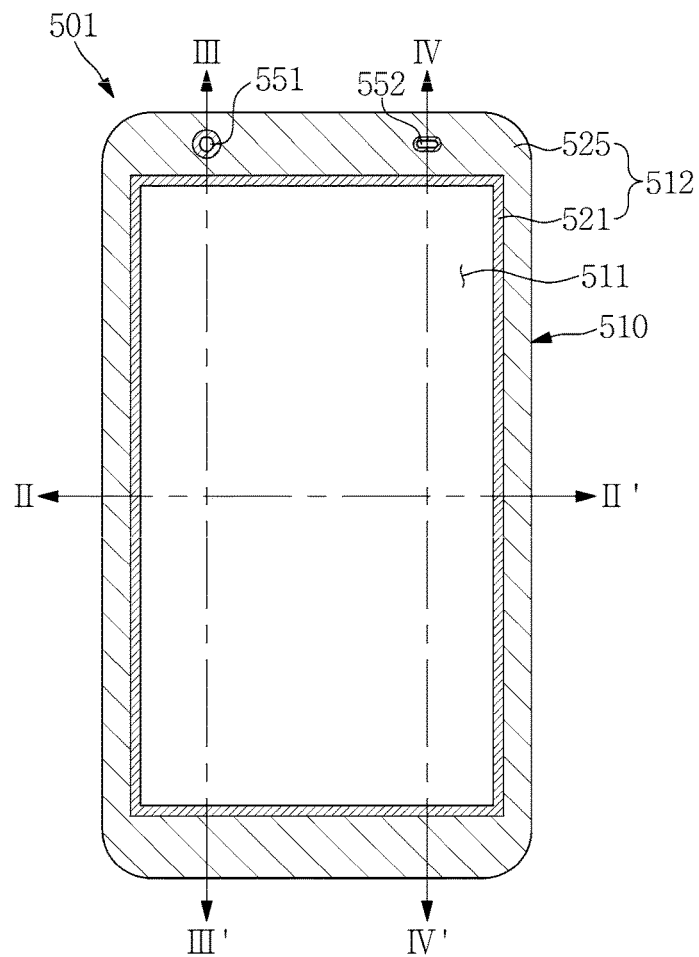
FIG. 3 is a plan view illustrating a window panel according to an embodiment.
Figure 4:
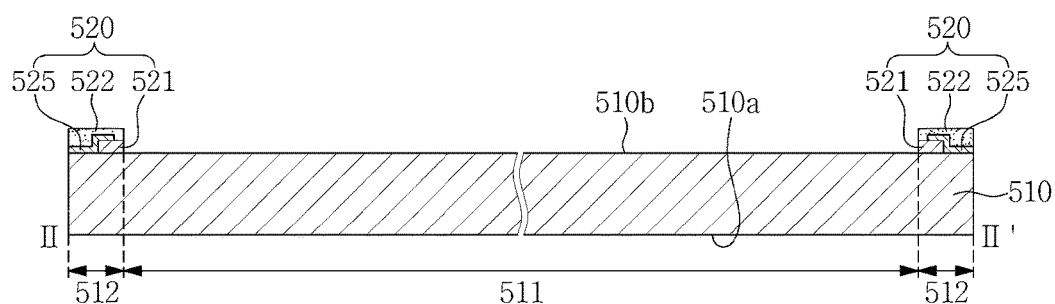
FIG. 4 is a cross-sectional view taken along the line of FIG. 3 according to an embodiment.
Figure 5:
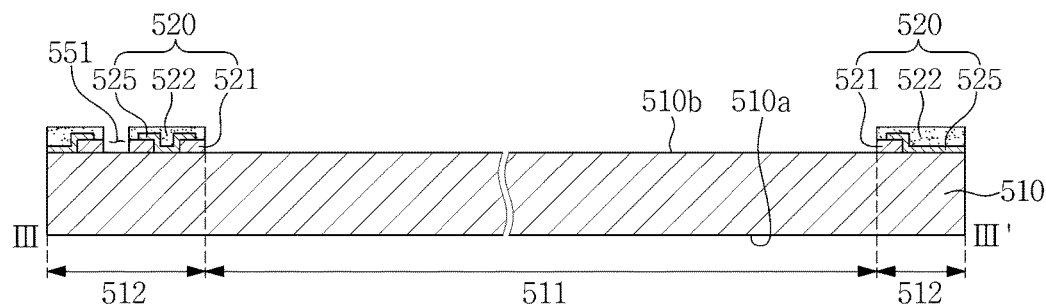
FIG. 5 is a cross-sectional view taken along the line of FIG. 3 according to an embodiment.
Figure 6:
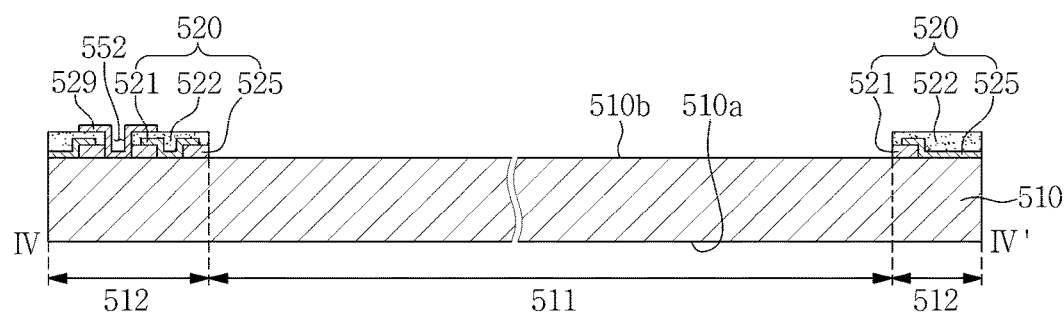
FIG. 6 is a cross-sectional view taken along the line IV-IV' of FIG. 3 according to an embodiment.

FIG. 3 is a plan view illustrating the window panel 501 according to an embodiment, FIG. 4 is a cross-sectional view taken along the line of FIG. 3, FIG. 5 is a cross-sectional view taken along the line of FIG. 3, and FIG. 6 is a cross-sectional view taken along the line IV-IV' of FIG. 3.

The window panel 501 includes a base substrate 510 and a bezel portion 520 (or bezel 520) disposed on the base substrate 510.

The base substrate 510 may be transparent and include a light transmitting member such as glass, plastic, or the like. The base substrate 510 includes a first surface 510a and a second surface 510b.

Referring to FIG. 2, the first surface 510a of the base substrate 510 faces toward the user, and the second surface 510b of the base substrate 510 faces toward the display panel 110. In FIGS. 4, 5 and 6, the second surface 510b of the base substrate 510 facing toward the display panel 110 is located at an upper portion of the drawings, and the first surface 510a of the base substrate 510 facing toward the user is located at a lower portion of the drawings.

The bezel portion 520 is disposed at the second surface 510b of the base substrate 510. Referring to FIGS. 2, 3, 4, 5 and 6, the bezel portion 520 is disposed at an edge portion of the base substrate 510.

For example, the bezel portion 520 is disposed on the base substrate 510 so as to overlap the non-display area NDA of the display panel 110. The bezel portion 520 is an opaque layer to block light. Accordingly, elements below the bezel portion 520 is prevented from been viewed by the user.

The bezel portion 520 may define a light transmitting area 511 and a light blocking area 512 of the base substrate 510. A portion of the base substrate 510 at which the bezel portion 520 is disposed corresponds to the light blocking area 512, and a portion of the base substrate 510 at which the bezel portion 520 is absent corresponds to the light transmitting area 511. An image generated in the display panel 110 is viewed by the user through the light transmitting area 511 of the window panel 501.

The bezel portion 520 includes a first light blocking layer 521, a cover member 525, and a second light blocking layer 522 on the base substrate 510.

The first light blocking layer 521, in a plan view of the display device, is disposed outside the display area DA along an edge of the display area DA. For example, the first light blocking layer 521 may have linear sections parallel to boundary sections between the display area DA and the non-display area NDA of the display panel 110.

The first light blocking layer 521 defines the light transmitting area 511 of the base substrate 510 and serves as a boundary of the light blocking area 512.

The first light blocking layer 521 may be formed by a printing method using a set of ink. The first light blocking layer 521 may have a thickness in a range from about 0.1 μm to about 100 μm and a width in a range from about 1 μm to about 100 μm. The thickness and the width of the first light blocking layer 521 may be configured in consideration of the size of the window panel 501.

The cover member 525 is disposed on the base substrate 510 and covers (e.g., overlaps) at least a portion of the first light blocking layer 521. A portion of the cover member 525 is disposed on a layer substantially the same as a layer on which the first light blocking layer 521 is disposed and therefore has a face substantially coplanar with a face of the first light blocking layer 521. The cover member 525 is disposed adjacent to the first light blocking layer 521 and overlaps (e.g., is applied to) a side surface of the first light blocking layer 521. In an embodiment, the cover member 525 may overlap (e.g., be applied to) a portion of the side surface and a portion of an upper surface of the first light blocking layer 521. In an embodiment, the cover member 525 may overlap (e.g., be applied to) an entire portion of the side surface and the upper surface of the first light blocking layer 521.

The cover member 525 is formed by deposition. The cover member 525 may have a thickness in a range from about 5 nm to about 500 nm. In embodiments, the cover member 525 may have a thickness of less than about 5 nm and more than about 500 nm.

According to an embodiment, the cover member 525 includes a metal and/or is a metal layer. That is, the cover member 525 may be formed by deposition of a metal. The cover member 525 including a metal may exhibit a same visual sensation as that of the metal. Accordingly, the bezel portion 520 may have an appearance that it is made of metal. There is no particular limitation on the kind of metal used for forming the cover member 525. A metal that may be deposited may be used to form the cover member 525 without limitation. For example, silver (Ag), gold (Au), aluminum (Al), copper (Cu), titanium (Ti), nickel (Ni), and the like may be used to form the cover member 525.

Areas of the bezel portion 520 may be defined by the first light blocking layer 521 and the cover member 525. Further, an area at which the first light blocking layer 521 and the cover member 525 are disposed corresponds to the light blocking area 512, and an area at which the first light blocking layer 521 and the cover member 525 are absent corresponds to the light transmitting area 511.

The second light blocking layer 522 is disposed on the cover member 525 and the first light blocking layer 521.

Light transmission through the bezel portion 520 is blocked by the second light blocking layer 522.

Since the cover member 525 has a thin thickness, light may pass through the cover member 525. Accordingly, in the case where the second light blocking layer 522 is not disposed on the cover member 525, the non-display area NDA of the display panel 110 may be viewed by the user through the cover member 525. In an embodiment, the second light blocking layer 522 is disposed on the cover member 525, the light transmission through the bezel portion 520 is blocked, and the non-display area NDA of the display panel 110 is substantially prevented from being viewed by the user.

The second light blocking layer 522 may be formed by a printing method using a set of ink. The second light blocking layer 522 may have a width substantially equal to a width of the bezel portion 520, e.g., in a range from about 0.5 μm to about 100 μm. The thickness and the width of the second light blocking layer 522 may be configured in consideration of the size of the window panel 501.

The bezel portion 520 may have sensor holes 551 and 552, which may be through holes. The sensor holes 551 and 552 may be formed through at least one of the first light blocking layer 521, the second light blocking layer 522, and the cover member 525. Light may be transmitted through such sensor holes 551 and 552.

A camera lens or an infrared sensor may be disposed below at least one of the sensor holes 551 and 552. In an embodiment, photographing using a camera or infrared communication is possible through the sensor holes 551 and 552.

FIG. 5 shows a cross-section of a first sensor hole 551. The base substrate 510 is exposed by the first sensor hole 551. A camera lens, for example, may be disposed below the first sensor hole 551.

FIG. 6 shows a cross-section of a second sensor hole 552. A coating layer 529 is disposed at the second sensor hole 552. An infrared light transmitting layer, for example, may be used as the coating layer 529. The infrared light transmitting layer may pass infrared rays but block visible rays. An infrared sensor may be disposed below the second sensor hole 552.

Figure 7:
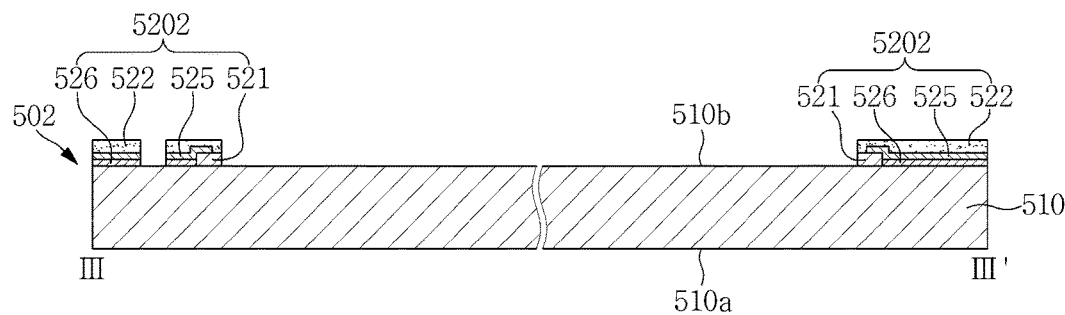
FIG. 7 is a cross-sectional view illustrating a window panel according to an embodiment.

FIG. 7 is a cross-sectional view illustrating a window panel 502 according to an embodiment.

The window panel 502 illustrated in FIG. 7 further includes a decor layer 526 disposed between a base substrate 510 and a cover member 525. Referring to FIG. 7, a bezel portion 5202 includes a first light blocking layer 521, the decor layer 526, the cover member 525, and a second light blocking layer 522.

The decor layer 526 is a layer for enhancing the aesthetics of the bezel portion 5202. The decor layer 526 may have various colors, patterns, decorations and the like. The decor layer 526 may be formed by a deposition or printing method.

Figure 8A:
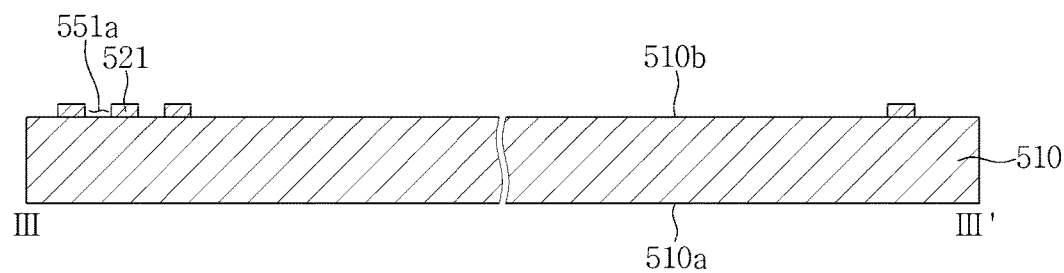
FIG. 8A, FIG. 8B, FIG. 8C, FIG. 8D, and FIG. 8E are cross-sectional views illustrating structures formed in a process of manufacturing a window panel according to an embodiment.

FIGS. 8A, 8B, 8C, 8D and 8E. FIGS. 8A, 8B, 8C, 8D and 8E are cross-sectional views illustrating structures formed in a process of manufacturing the window panel 501 according to an embodiment;

Referring to FIG. 8A, the first light blocking layer 521 is formed on the base substrate 510. The first light blocking layer 521 defines the light transmitting area 511 and the light blocking area 512 of the window panel 501. In an embodiment, a first sensor hole area 551a and a second sensor hole area (not illustrated) are also defined by the first light blocking layer 521.

The first light blocking layer 521 may be formed by a printing method using a set of ink and is formed on the second surface 510b of the base substrate 510.

Figure 8B:
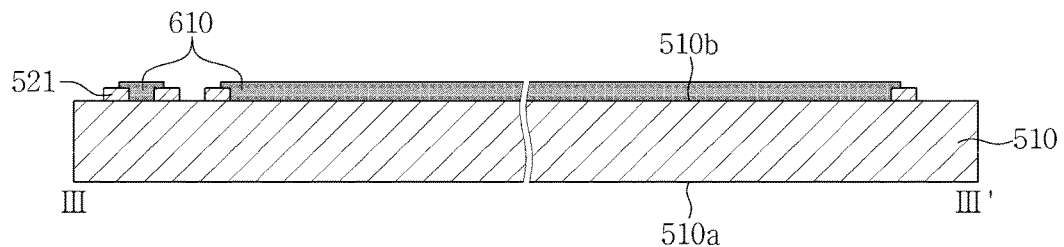

Referring to FIG. 8B, a mask 610 is disposed at the light transmitting area 511. The mask 610 is also disposed at the first sensor hole area 551a.

A polymer film may be used as the mask 610. The mask 610 including a polymer film has a weak adhesive force and may be easily removed after a deposition process.

In an embodiment, the mask 610 may be formed by a set of soluble ink. An example of the soluble ink may include a water-soluble ink which has weak binding force with the base material 510. Such ink may be dissolved in a solvent, such as water, to be removed after the deposition process.

Figure 8C:
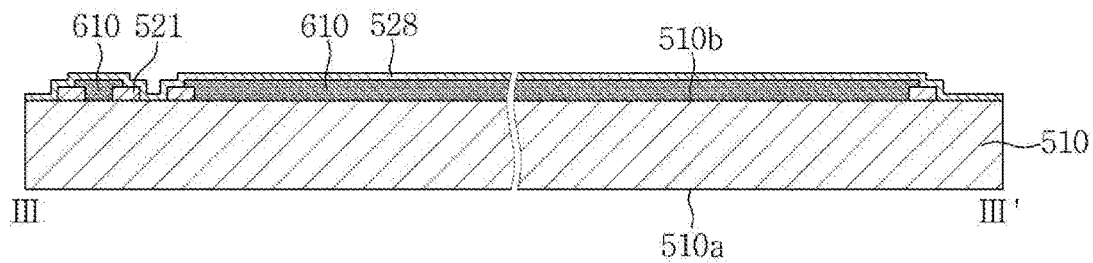

Referring to FIG. 8C, a deposited layer 528 (or material layer 528) is formed over an entire surface of the base substrate 510 including portions of the second surface 510b of the base substrate 510 exposed from the mask 610. The deposited layer 528 is applied to (e.g., overlaps and/or directly contacts) at least a portion of the first light blocking layer 521.

The deposited layer 528 may have a thickness in a range from about 5 nm to about 500 nm.

The deposited layer 528 may be formed by a deposition method using a deposition material. A metal may be used as the deposition material. For example, silver (Ag), gold (Au), aluminum (Al), copper (Cu), titanium (Ti), nickel (Ni) and the like may be used as the deposition material. In an embodiment, an organic material may be used as the deposition material.

Figure 8D:
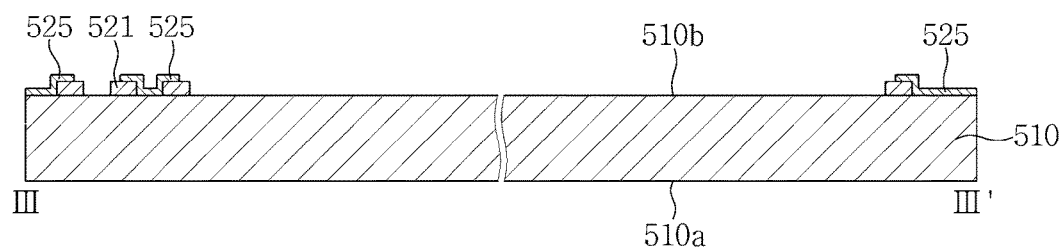

Referring to FIG. 8D, the mask 610 and a portion of the deposited layer 528 disposed on the mask 610 are removed. By removing the portion of the deposited layer 528 on the mask 610, the cover member 525 (which is a remaining portion of the deposited layer 528) is formed.

Figure 8E:
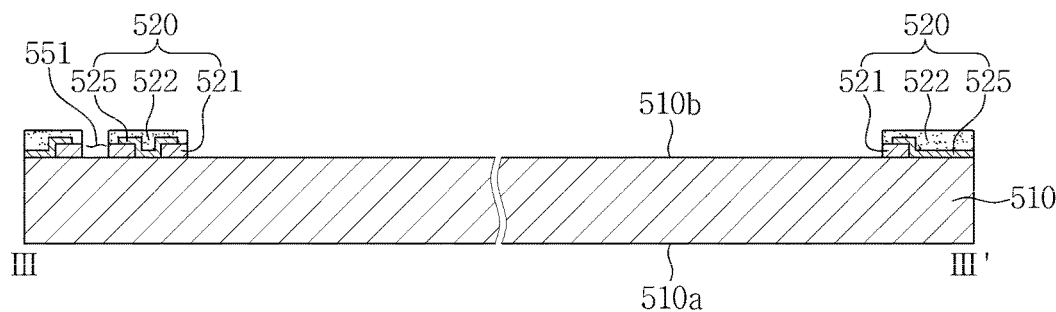

Referring to FIG. 8E, the second light blocking layer 522 is formed on the first light blocking layer 521 and the cover member 525 to form the window panel 501.

The second light blocking layer 522 may be formed through a printing method using a set of ink. The second light blocking layer 522 may have a width substantially equal to a width of the bezel portion 520.

Although not illustrated, the second sensor hole 552 may be defined/formed in a manner substantially identical to or analogous to a manner in which the first sensor hole 551 is defined/formed. The coating layer 529 may be further disposed at the second sensor hole 552.

In an embodiment, the decor layer 526 may be formed on the base substrate 510 before forming the deposited layer illustrated in FIG. 8C. Accordingly, the window panel 502 illustrated in FIG. 7 may be formed.

FIGS. 9A, 9B, 9C, 9D, 9E and 9F are cross-sectional views illustrating structures formed in a process of manufacturing a window panel according to an embodiment.

Figure 9A:
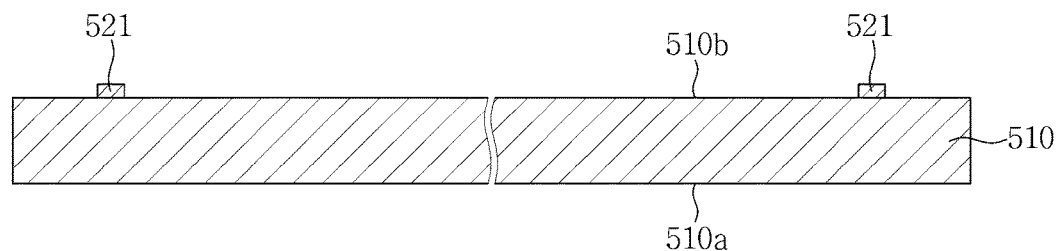
FIG. 9A, FIG. 9B, FIG. 9C, FIG. 9D, FIG. 9E, and FIG. 9F are views illustrating structures formed in a process of manufacturing a window panel according to an embodiment.

Referring to FIG. 9A, the first light blocking layer 521 which defines the light transmitting area 511 and the light blocking area 512 of the window panel 501 is formed on the base substrate 510.

Figure 9B:
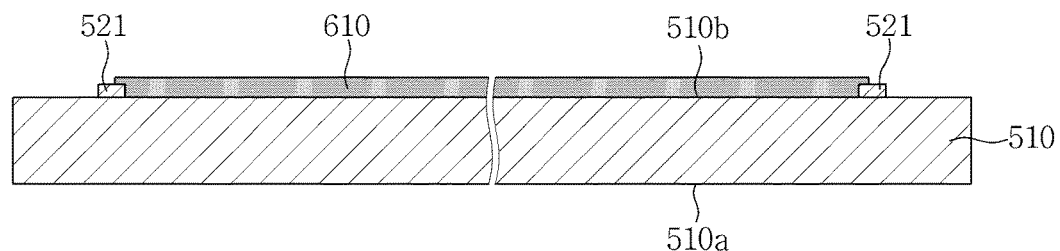

Referring to FIG. 9B, a mask 610 is disposed at the light transmitting area 511.

Figure 9C:
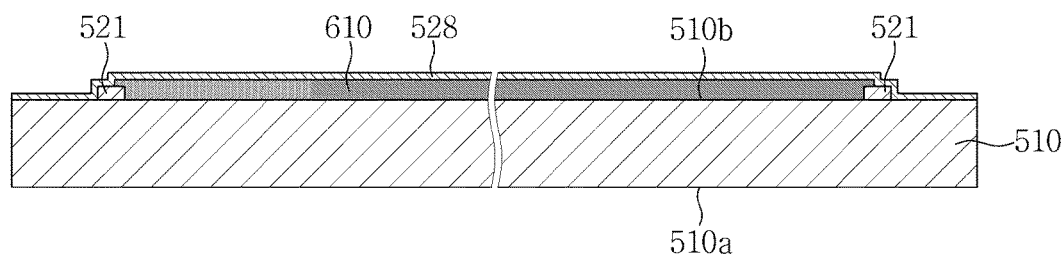

Referring to FIG. 9C, a deposited layer 528 is formed over an entire surface of the base substrate 510 including a surface of the base substrate 510 exposed from the mask 610. In such an embodiment, the deposited layer 528 is applied to (e.g., overlaps) at least a portion of the first light blocking layer 521.

Figure 9D:
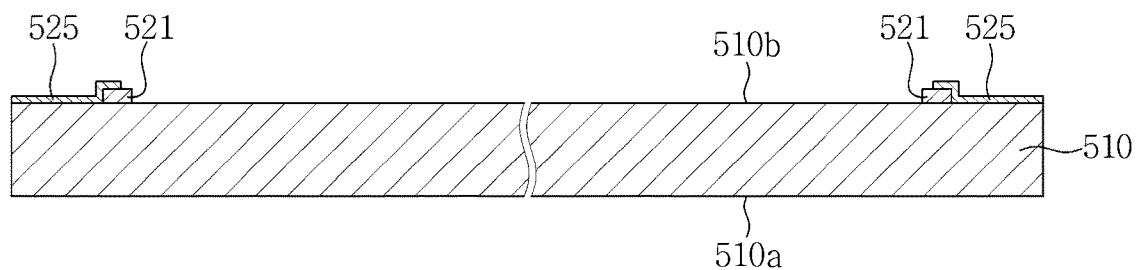

Referring to FIG. 9D, the mask 610 and a portion of the deposited layer 528 on the mask 610 are removed. By removing the mask 610 and the portion of the deposited layer 528 on the mask 610, the cover member 525 is formed using a remaining portion of the deposited layer 528.

Figure 9E:
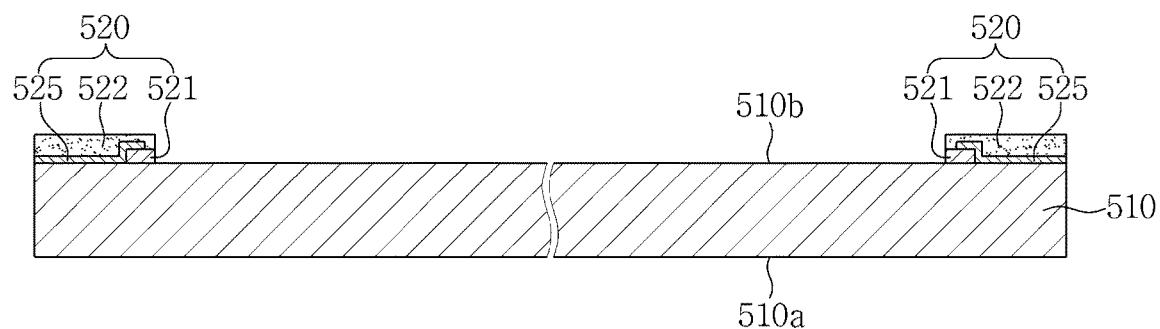

Referring to FIG. 9E, the second light blocking layer 522 is disposed on the first light blocking layer 521 and the cover member 525.

Figure 9F:
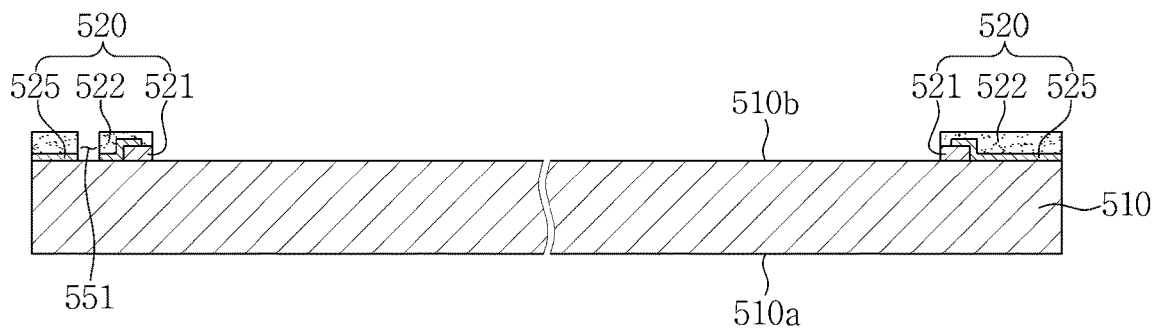

Subsequently, referring to FIG. 9F, the sensor holes 551 and 552 are defined and/or formed. For example, the cover member 525 and the second light blocking layer 522 are partially removed to define and/or form the first sensor hole 551. The second sensor hole 552 may be defined and/or formed in a manner substantially identical to or analogous to a manner in which the first sensor hole 551 is defined and/or formed.

Figure 10:
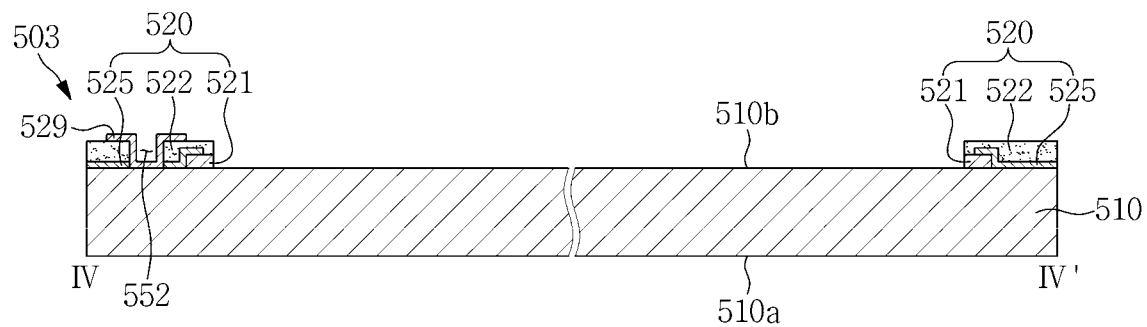
FIG. 10 is a cross-sectional view illustrating a window panel according to an embodiment.

FIG. 10 is a cross-sectional view illustrating a window panel 503 according to an embodiment. The window panel 503 illustrated in FIG. 10 includes a coating layer 529 disposed at a second sensor hole 552. For example, the coating layer 529 may be further disposed at the second sensor hole 552 defined in FIG. 9F. An infrared light transmitting print layer, for example, may be used as the coating layer 529.

Figure 11:
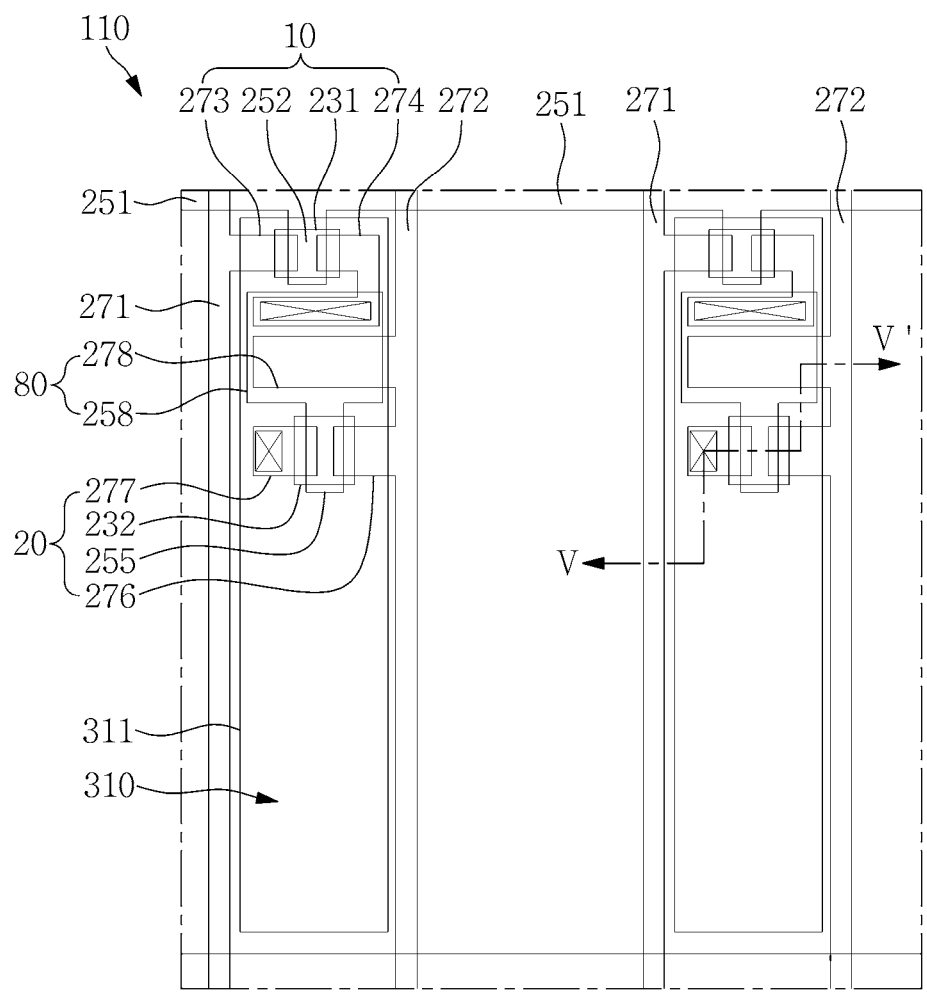
FIG. 11 is a plan view illustrating a pixel arrangement of a display panel according to an embodiment.
Figure 12:
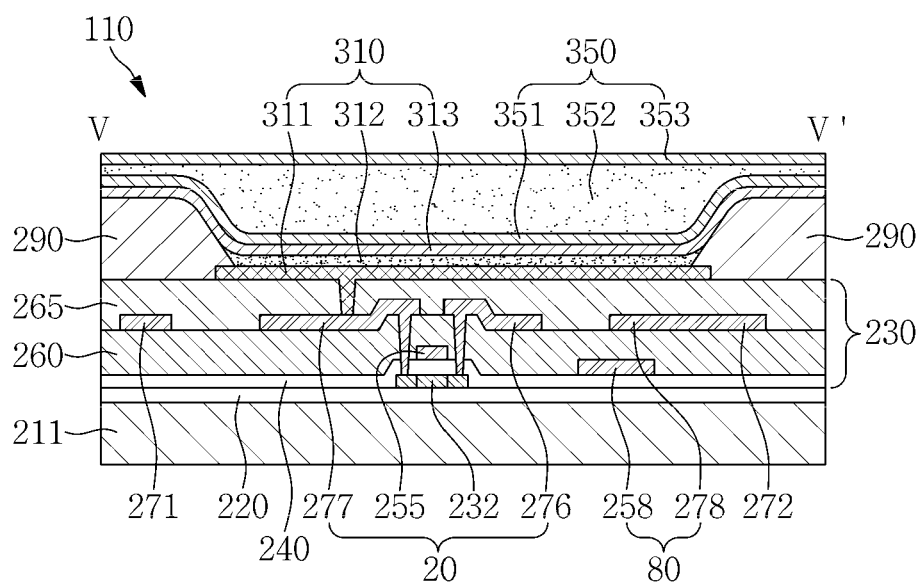
FIG. 12 is a cross-sectional view taken along the line V-V of FIG. 11 according to an embodiment.

FIG. 11 is a plan view illustrating a pixel arrangement of the display panel 110 according to an embodiment, and FIG. 12 is a cross-sectional view taken along the line V-V of FIG. 11.

For example, the display panel 110 illustrated in FIGS. 11 and 12 is an OLED display panel. The OLED display panel includes a first substrate 211, a driving circuit unit 230 and an OLED 310.

The first substrate 211 may include an insulating material selected from the group consisting of: glass, quartz, ceramic, plastic, or the like. The first substrate 211 may include a polymer film.

A buffer layer 220 is disposed on the first substrate 211. The buffer layer 220 may include one or more layers selected from various inorganic layers and organic layers. The buffer layer 220 may be omitted.

The driving circuit unit 230 is disposed on the buffer layer 220. The driving circuit unit 230 includes a plurality of thin film transistors (TFT) 10 and 20, and drives the OLED 310. That is, the OLED 310 emits a light according to a driving signal received from the driving circuit unit 230 to display an image.

FIGS. 11 and 12 illustrate an active matrix-type organic light emitting diode (AMOLED) display panel having a 2Tr-1Cap structure. For example, the 2Tr-1Cap structure may include two TFTs, e.g., a switching TFT 10 and a driving TFT 20 and one capacitor 80 in each pixel. For example, the OLED display panel may include three or more TFTs and two or more capacitors in each pixel and may further include additional wirings. Herein, the term "pixel" refers to a smallest unit for displaying an image and the OLED display panel displays an image using a plurality of pixels.

Each pixel includes a switching TFT 10, a driving TFT 20, the capacitor 80 and the OLED 310. In addition, a gate line 251 extending along one direction and a data line 271 and a common power line 272 insulated from and crossing the gate line 251 are also disposed at the driving circuit unit 230. Each pixel may be defined by the gate line 251, the data line 271 and the common power line 272 as a boundary. The pixels may be defined by a pixel defining layer 290 or a black matrix.

The OLED 310 includes a first electrode 311, an organic light emitting layer 312 on the first electrode 311 and a second electrode 313 on the organic light emitting layer 312. The organic light emitting layer 312 may include a low molecular weight organic material or a high molecular weight organic material. Holes and electrons are injected into the organic light emitting layer 312 from the first electrode 311 and the second electrode 313, respectively, and combined therein to form an exciton. A light is emitted when the exciton falls from an excited state to a ground state.

The capacitor 80 includes a pair of capacitor plates 258 and 278, having an insulating interlayer 260 interposed between the capacitor plates 258 and 278. In an embodiment, the insulating interlayer 260 may be a dielectric element. A capacitance of the capacitor 80 is determined by electric charges accumulated in the capacitor 80 and a voltage across the pair of capacitor plates 258 and 278.

The switching TFT 10 includes a switching semiconductor layer 231, a switching gate electrode 252, a switching source electrode 273 and a switching drain electrode 274. The driving TFT 20 includes a driving semiconductor layer 232, a driving gate electrode 255, a driving source electrode 276 and a driving drain electrode 277. A gate insulating layer 240 is further provided to insulate the semiconductor layers 231 and 232 and the gate electrodes 252 and 255.

The switching TFT 10 is used as a switching element which selects a pixel to perform light emission. The switching gate electrode 252 is connected to the gate line 251 and the switching source electrode 273 is connected to the data line 271. Spaced apart from the switching source electrode 273, the switching drain electrode 274 is connected to one of the capacitor plates, e.g., a capacitor plate 258.

The driving TFT 20 applies a driving power, which allows an organic light emitting layer 312 of an OLED 310 in a selected pixel to emit light, to the first electrode 311 which is a pixel electrode. The driving gate electrode 255 is connected to the capacitor plate 258 that is connected to the switching drain electrode 274. Each of the driving source electrode 276 and another of the capacitor plates, e.g., a capacitor plate 278, is connected to the common power line 272. The driving drain electrode 277 is connected to the first electrode 311 of the OLED 310 through a contact hole defined at a planarization layer 265.

With the above-described structure, the switching TFT 10 is driven based on a gate voltage applied to the gate line 251 and serves to transmit a data voltage applied to the data line 271 to the driving TFT 20. A voltage equivalent to a difference between a common voltage applied to the driving TFT 20 from the common power line 272 and the data voltage transmitted by (or from) the switching TFT 10 is stored in the capacitor 80 and a current corresponding to the voltage stored in the capacitor 80 flows to the OLED 310 through the driving TFT 20 such that the OLED 310 may emit light.

The first electrode 311 may be a translucent electrode having light transmittance or a reflective electrode having light reflectivity. The second electrode 313 may include a transflective film or a reflective film.

Referring to FIG. 12, the first electrode 311 is a reflective electrode and the second electrode 313 is a transflective electrode. A light generated in the organic light emitting layer 312 is emitted through the second electrode 313. In embodiments, the first electrode 311 may be a translucent electrode, the second electrode 313 may be a reflective electrode and a light generated in the organic light emitting layer 312 may be emitted through the first electrode 311.

At least one of a hole injection layer HIL and a hole transport layer HTL may further be provided between the first electrode 311 and the organic light emitting layer 312 and at least one of an electron transport layer ETL and an electron injection layer EIL may further be provided between the organic light emitting layer 312 and the second electrode 313. The organic light emitting layer 312, the hole injection layer HIL, the hole transport layer HTL, the electron transport layer ETL and the electron injection layer EIL may include an organic material and thus may be referred to as an organic layer.

The pixel defining layer 290 has an opening. The opening of the pixel defining layer 290 exposes a portion of the first electrode 311. The organic light emitting layer 312 and the second electrode 313 are sequentially stacked on the first electrode 311 at the opening of the pixel defining layer 290. In such an embodiment, the second electrode 313 is formed on the pixel defining layer 290 as well as on the organic light emitting layer 312. The OLED 310 generates light in the organic light emitting layer 312 located at the opening of the pixel defining layer 290. In such a manner, the pixel defining layer 290 may define a light emission area.

A capping layer (not illustrated) may be disposed on the second electrode 313 so as to protect the OLED 310 from the external environment.

Referring to FIG. 12, a thin film encapsulation layer 350 is disposed on the second electrode 313.

The thin film encapsulation layer 350 includes one or more inorganic layers 351 and 353 and one or more organic layers 352 and substantially prevents outside air such as moisture or oxygen from penetrating into the OLED 310.

The thin film encapsulation layer 350 has a structure in which the inorganic layers 351 and 353 and the organic layer 352 are alternately stacked. The thin film encapsulation layer 350 illustrated in FIG. 12 includes two inorganic layers 351 and 353 and one organic layer 352.

Each of the inorganic layers 351 and 353 may include one or more inorganic materials of: $Al_2O_3$, $TiO_2$, ZrO, $SiO_2$, AlON, AlN, SiON, $Si_3N_4$, ZnO and $Ta_2O_5$. The inorganic layers 351 and 353 may be formed through methods such as a chemical vapor deposition (CVD) method or an atomic layer deposition (ALD) method. In embodiments, the inorganic layers 351 and 353 may be formed using other methods.

The organic layer 352 may include a polymer-based material. Examples of the polymer-based material may include an acrylic resin, an epoxy resin, polyimide and polyethylene. In addition, the organic layer 352 is formed through a thermal deposition process. The thermal deposition process for forming the organic layer 352 may be performed within a temperature range that may not damage the OLED 310. In embodiments, the organic layer 352 may be formed using other methods known.

The inorganic layers 351 and 353 which have a high density of thin film may substantially prevent or efficiently reduce infiltration of, mostly, moisture or oxygen. Permeation of moisture and oxygen into the OLED 310 may be largely prevented by the inorganic layers 351 and 353.

The moisture and oxygen that have passed through the inorganic layers 351 and 353 are blocked again by the organic layer 352. The organic layer 352 also functions as a buffer layer for reducing the stress between the respective ones of the inorganic layers 351 and 353, in addition to the moisture permeation suppression. In addition, since the organic layer 352 has planarizing characteristics, an uppermost surface of the thin film sealing layer 350 may become flat.

The thin film encapsulation layer 350 may have a thickness of about 10 μm or less. Accordingly, the OLED display panel may also have a small thickness. By applying the thin film encapsulation layer 350 in such a manner, the OLED display panel may have flexible characteristics.

Figure 13:
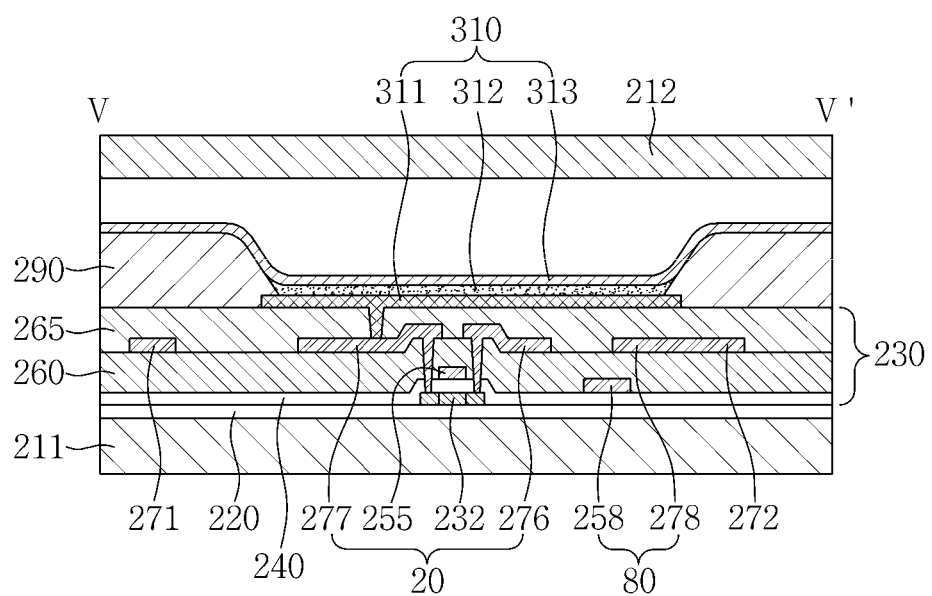
FIG. 13 is a cross-sectional view illustrating a display panel according to an embodiment.

FIG. 13 is a cross-sectional view illustrating a display panel according to an embodiment.

Referring to FIG. 13, a second substrate 212 is disposed on a second electrode 313 to protect an OLED 310. The second substrate 212 serves to seal the OLED 310 together with a first substrate 211. The second substrate 212 may include an insulating material selected from the group consisting of glass, quartz, ceramics and plastic, as in the case of the first substrate 211. In addition, a filler may be disposed between the OLED 310 and the second substrate 212.

Figure 14:
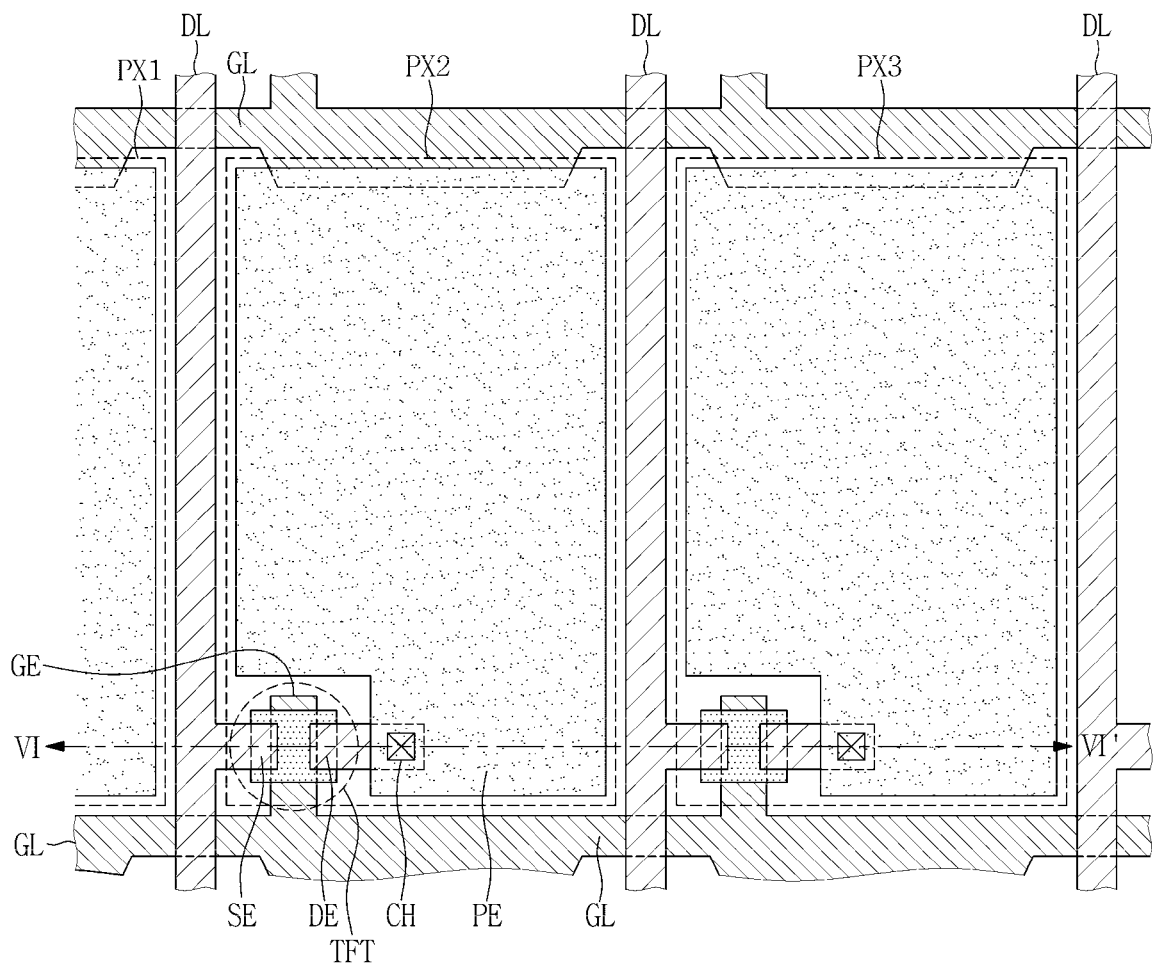
FIG. 14 is a plan view illustrating a pixel arrangement of a display panel according to an embodiment.
Figure 15:
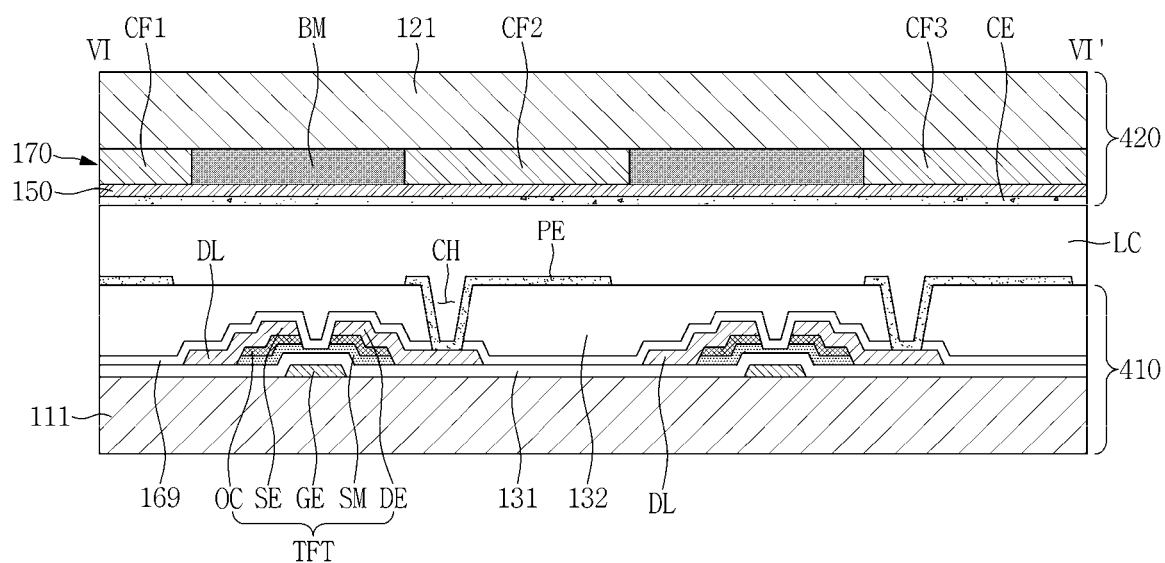
FIG. 15 is a cross-sectional view taken along the line VI-VI' of FIG. 14.

FIG. 14 is a plan view illustrating a pixel arrangement of a display panel according to an embodiment, and FIG. 15 is a cross-sectional view taken along the line VI-VI' of FIG. 14. For example, FIGS. 14 and 15 illustrate an LCD panel.

The LCD panel illustrated in FIGS. 14 and 15 includes a display substrate 410, an opposing substrate 420 and a liquid crystal layer LC disposed between the display substrate 410 and the opposing substrate 420.

The display substrate 410 includes a first substrate 111, a TFT, a pixel electrode PE, a gate insulating layer 131 and a passivation layer 132. The TFT includes a semiconductor layer SM, an ohmic contact layer OC, a gate electrode GE, a source electrode SE and a drain electrode DE.

The first substrate 111 includes transparent glass, plastic, or the like.

A plurality of gate lines GL and a plurality of gate electrodes GE are disposed on the first substrate 111. The gate electrode GE is connected to the gate line GL. The gate line GL and the gate electrode GE may include or be formed of one of: aluminum (Al) or alloys thereof, silver (Ag) or alloys thereof, copper (Cu) or alloys thereof, molybdenum (Mo) or alloys thereof, chromium (Cr), tantalum (Ta), and/or titanium (Ti). At least one of the gate line GL and the gate electrode GE may have a multilayer structure including at least two conductive layers that have different physical properties.

The gate insulating layer 131 is disposed over an entire surface of the first substrate 111 including the gate line GL and the gate electrode GE. The gate insulating layer 131 may include or be formed of silicon nitride (SiNx) or silicon oxide (SiOx). In addition, the gate insulating layer 131 may have a multilayer structure including at least two insulating layers that have different physical properties.

The semiconductor layer SM is disposed on the gate insulating layer 131. In such an embodiment, the semiconductor layer SM overlaps the gate electrode GE below the gate insulating layer 131. The semiconductor layer SM may include amorphous silicon, polycrystalline silicon, or the like. The semiconductor layer SM may include an oxide semiconductor.

The ohmic contact layer OC is disposed on the semiconductor layer SM. For example, the ohmic contact layer OC is disposed on the semiconductor layer SM other than a channel portion thereof.

In an embodiment, data lines DL are disposed on the gate insulating layer 131. The data line DL crosses the gate line GL. The source electrode SE is connected to the data line DL and is disposed on the ohmic contact layer OC. The drain electrode DE, spaced apart from the source electrode SE, is disposed on the ohmic contact layer OC and is connected to the pixel electrode PE.

At least one of the data line DL, the source electrode SE and the drain electrode DE may include or be formed of a refractory metal, e.g., molybdenum, chromium, tantalum and titanium, and/or an alloy thereof. In addition, at least one of the data line DL, the source electrode SE and the drain electrode DE may have a multilayer structure including a refractory metal layer and a low-resistance conductive layer.

An insulating interlayer 169 is disposed over an entire surface of the first substrate 111 including the gate insulating layer 131, the semiconductor layer SM, the data line DL, the source electrode SE and the drain electrode DE. The insulating interlayer 169 may include an insulating material and in particular, protects a channel area which is an exposed portion of the semiconductor layer SM.

The passivation layer 132 is disposed on the insulating interlayer 169. The passivation layer 132 serves to planarize an upper portion of the TFT. Accordingly, the passivation layer 132 is also referred to as a planarization film.

The passivation layer 132 may include an inorganic insulating material such as silicon nitride (SiNx) or silicon oxide (SiOx). In an embodiment, the passivation layer 132 may include an organic layer. The passivation layer 132 may have a bilayer structure including a lower inorganic layer and an upper organic layer.

The pixel electrode PE is disposed on the passivation layer 132. In such an embodiment, the pixel electrode PE is connected to the drain electrode DE through a contact hole CH defined through the passivation layer 132 and the insulating interlayer 169. The pixel electrode PE may include a transparent conductive material, e.g., indium tin oxide (ITO) or indium zinc oxide (IZO).

The opposing substrate 420 includes a second substrate 121, a color filter layer 170 and a common electrode CE.

The second substrate 121 includes transparent glass or plastic.

A light blocking portion BM is disposed on the second substrate 121. The light blocking portion BM has a plurality of openings. The openings are arranged corresponding to respective pixel electrodes PE of first, second and third pixels PX1, PX2 and PX3. The light blocking portion BM blocks light in areas other than the openings. For example, the light blocking portion BM is disposed on the TFT, the gate line GL and the data line DL to block a light that has passed through the TFT, the gate line GL and the data line DL from being emitted to the outside. The light blocking portion BM is not invariably necessarily and may be omitted.

The color filter layer 170 is disposed on the second substrate 121 and selectively blocks a wavelength of a light incident from a backlight unit (not illustrated).

The color filter layer 170 includes a color filter. For example, the color filter layer 170 may include a first color filter CF1, a second color filter CF2 and a third color filter CF3.

The first, second and third color filters CF1, CF2 and CF3 may be distinguished from each other by the light blocking portion BM. Referring to FIGS. 14 and 15, the first, second and third color filters CF1, CF2 and CF3 are arranged so as to overlap the first, second and third pixels PX1, PX2 and PX3, respectively. Each of the first, second and third color filters CF1, CF2 and CF3 may represent any one of red, green and blue colors. The color filter layer 170 may include a white color filter (not illustrated) or may include a color filter having a color other than red, green and blue.

A passivation layer 150 may be disposed between the color filter layer 170 and the common electrode CE. The passivation layer 150 may be omitted.

The common electrode CE is disposed on the passivation layer 150. For example, the common electrode CE may be disposed over an entire surface of the second substrate 121. The common electrode CE may include a transparent conductive material such as ITO or IZO.

The common electrode CE applies an electric field to the liquid crystal layer LC together with the pixel electrode PE.

Although not illustrated, a lower alignment layer may be disposed on the common electrode CE. The lower alignment layer may be a vertical alignment layer and may include a photosensitive material. Similarly, although not illustrated, an upper alignment layer may be disposed on the common electrode CE. The upper alignment layer may include a material substantially the same as a material included in the lower alignment layer.

When a surface of the first substrate 111 and a surface of the second substrate 121 that face each other are respectively defined as upper surfaces of the corresponding substrates and surfaces located on opposite sides of the upper surfaces are respectively defined as lower surfaces of the corresponding substrates, a polarizer may be disposed on each of the lower surface of the first substrate 111 and the lower surface of the second substrate 121.

As set forth hereinabove, according to embodiments, in the process of forming a cover member of a window panel, a mask is used, and no etching process is applied. Accordingly, no etching defect occurs in the cover member formation process.

While embodiments have been illustrated and described, it will be apparent to those of ordinary skill in the art that various changes in form and detail may be made to the embodiments without departing from the spirit and scope defined by the claims.

What is claimed is:

1. A window panel comprising:
a base substrate;

a first light blocking layer covering a covered portion of the base substrate and exposing an exposed portion of the base substrate;

a cover member surrounding the exposed portion of the base substrate in a plan view of the window panel and overlapping the first light blocking layer; and a second light blocking layer overlapping both the first light blocking layer and the cover member, wherein a first section of the cover member is bent relative to a second section of the cover member, wherein the second section of the cover member directly contacts a face of the base substrate, and wherein two surfaces of the first light blocking layer are opposite each other in a direction parallel to the face of the base substrate and are positioned between the exposed portion of the base substrate and at least one of the first section of the cover member and the second section of the cover member in the direction parallel to the face of the base substrate.

2. The window panel of claim 1, wherein a face of the first light blocking layer is coplanar with a face of the cover member.

3. The window panel of claim 1, wherein the cover member is a metal member, and wherein a thickness of the cover member is in a range from 5 nm to 500 nm.

4. The window panel of claim 1, further comprising a decor layer positioned between the base substrate and the cover member and directly contacting at least one of the base substrate, the cover member, and the first light blocking layer.

5. The window panel of claim 1, wherein the first light blocking layer has a through hole, wherein a portion of the first light blocking layer is positioned between the hole and the exposed portion of the base substrate.

6. The window panel of claim 5, further comprising an infrared light transmitting coating layer disposed in the through hole.

7. The window panel of claim 1, wherein the width of the second light blocking layer is equal to the sum of the width of the cover member in contact with the base substrate and the width of the first light blocking layer in contact with the base substrate.

8. A display device comprising:
a display panel comprising a display area and a non-display area;
a base substrate overlapping the display panel;
a first light blocking layer positioned between the display panel and the base substrate, overlapping the non-display area, and exposing the display area; and
a cover member positioned between the display panel and the base substrate, overlapping the first light blocking layer, overlapping the non-display area, exposing the display area, and having a first section and a second section, wherein the second section is directly connected to the first section and is bent relative to the first section; and
a second light blocking layer overlapping both the first light blocking layer and the cover member, wherein each of the first section and the second section of the cover member is positioned between a face of the second light blocking layer and the base substrate in a direction perpendicular to the face of the second light blocking layer, and wherein two surfaces of the first light blocking layer are opposite each other in a direction parallel to the face of the second light blocking layer and are positioned between the display area and the second section of the cover member in the direction parallel to the face of the second light blocking layer.

9. The display device of claim 8, wherein second light blocking layer overlaps the non-display area, and exposes the display area.

10. The display device of claim 8, wherein the cover member surrounds the display area in a plan view of the display device.

11. The display device of claim 8, wherein a portion of the cover member directly contacts the first light blocking layer and is positioned between the display panel and the first light blocking layer.

12. The display device of claim 8, wherein the base substrate is transparent and directly contacts both the first light blocking layer and the cover member.

13. The display device of claim 8, wherein the cover member is a metal member, and wherein a thickness of the cover member is in a range from 5 nm to 500 nm.

14. The display device of claim 8, wherein the width of the second light blocking layer is equal to the sum of the width of the cover member in contact with the base substrate and the width of the first light blocking layer in contact with the base substrate.

* * * * *